(12) United States Patent
Adams et al.

(10) Patent No.: US 6,844,501 B2
(45) Date of Patent: Jan. 18, 2005

(54) FLAT FLEXIBLE CABLE

(75) Inventors: Winfried Adams, Sindelfingen (DE); Artur Schubert, Schwarzenbach (AT)

(73) Assignee: I&T Innovation Technology Entwicklungs- und Holding Aktiengesellschaft, Eisenstadt (AT)

( * ) Notice: Subject to any disclaimer, the term of this patent is extended or adjusted under 35 U.S.C. 154(b) by 0 days.

(21) Appl. No.: 09/877,837

(22) Filed: Jun. 8, 2001

(65) Prior Publication Data

US 2003/0019658 A1 Jan. 30, 2003

(30) Foreign Application Priority Data

| Jun. 8, 2000 | (EP) | ............................................. 00890188 |
| Sep. 1, 2000 | (EP) | ............................................. 00890268 |
| May 28, 2001 | (EP) | ............................................. 01890162 |

(51) Int. Cl.$^7$ ................................................ H01B 7/08

(52) U.S. Cl. ................................................ 174/117 FF

(58) Field of Search ......................... 174/117 F, 117 FF, 174/250, 268

(56) References Cited

U.S. PATENT DOCUMENTS

| 3,244,795 | A | * | 4/1966 | Latimer ....................... 174/259 |
| 3,459,879 | A | * | 8/1969 | Gerpheide .............. 174/117 FF |
| 4,367,585 | A | * | 1/1983 | Elliott et al. ................... 29/857 |
| 4,578,529 | A | * | 3/1986 | Look ....................... 174/117 FF |
| 4,707,671 | A | * | 11/1987 | Suzuki et al. ................... 333/1 |
| 2001/0011603 | A1 | * | 8/2001 | Ueno ..................... 174/117 FF |

* cited by examiner

Primary Examiner—Chau N. Nguyen
(74) Attorney, Agent, or Firm—Merchant & Gould

(57) ABSTRACT

The invention concerns a laminated or extruded flat flexible cable, also called an electrical flat conductor. The widths of the conductor tracks (2,2', 2") are staggered in an arithmetic sequence and that the spacings between adjacent conductor tracks are either equally large or are also staggered according to an arithmetic sequence with the same spacing as that of the conductor tracks. In one embodiment, it is proposed that contacting of the conductor tracks (2, 2', 2") occur independently of their width by means of connectors, for example, strip terminals, whose contacts are provided equidistant from each other at a spacing equal to the width of the narrowest conductor tracks multiplied by the spacing between conductor tracks.

3 Claims, 1 Drawing Sheet

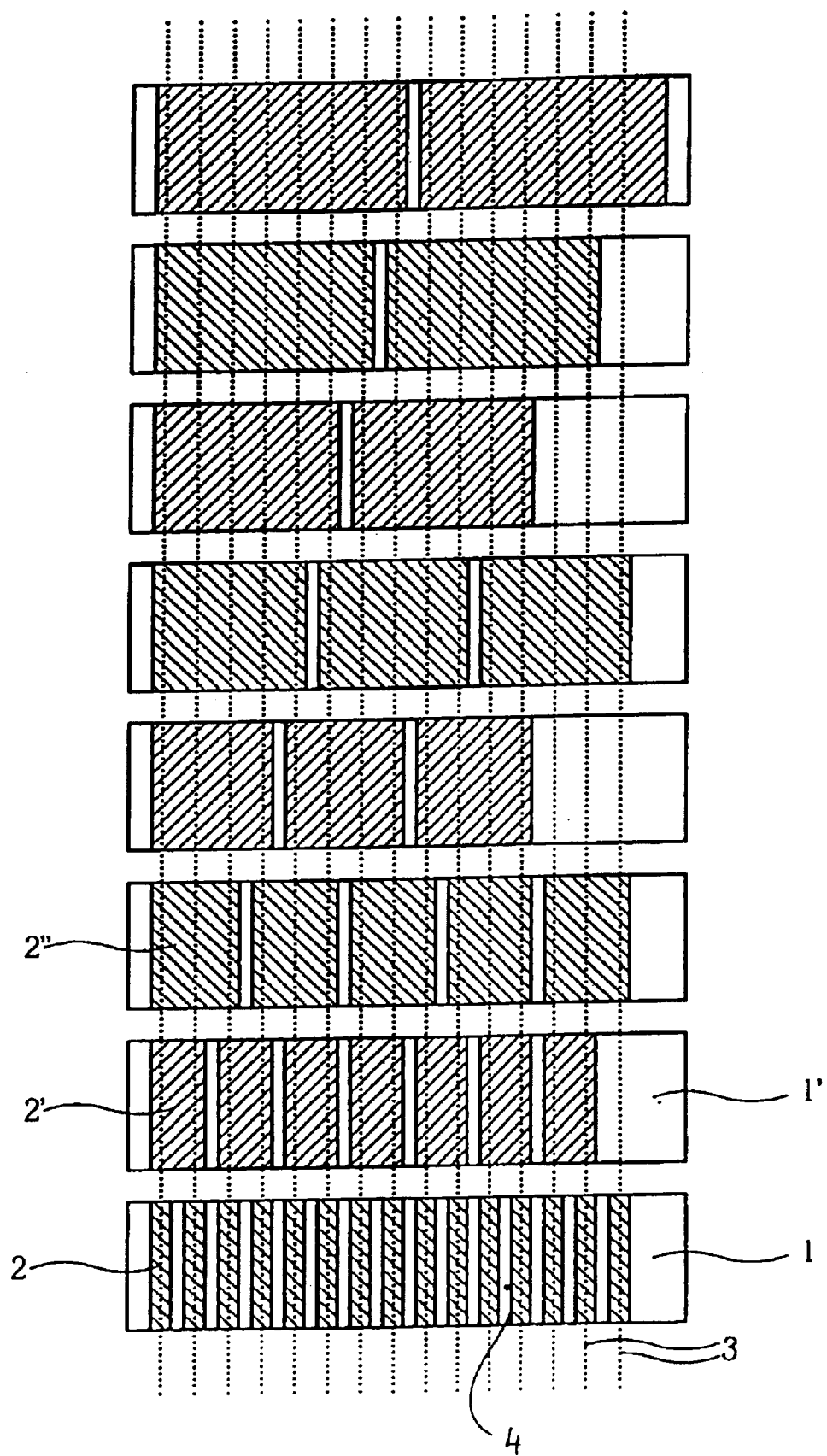

FLAT FLEXIBLE CABLE

FIELD OF THE INVENTION

The invention concerns a laminated or extruded flat flexible cable, also called electrical flat conductor,

BACKGROUND OF THE INVENTION

So-called laminated flat flexible cables consist essentially of a flexible electrically nonconducting support sheet, on which conductor tracks are provided, which have an essentially rectangular cross section and therefore are often called rectangular conductors. These conductor tracks are insulated from each other, i.e., arranged at a spacing from each other and are covered by a common cover sheet which was laminated onto the support sheet and conductor tracks by means of an appropriate adhesive.

The so-called extruded flat flexible cable consist essentially of conductor tracks with a spacing from each other and running parallel to each other in one plane, which are enclosed by means of an electrically nonconducting mass by an extrusion process.

Both types of flat flexible cables are fully equivalent for the invention and are increasingly used in the automotive industry, since they enjoy different advantages in handling and in accommodation relative to cable harnesses consisting of individual round cables and exhibit major advantages when free design height is extremely limited.

A shortcoming in these flat flexible cables is that because of the different dimensioning of the individual conductor tracks, depending on the current intensity to be withstood by them, contacting is complicated and that it is particularly problematical to devise connections to circuit boards of control devices, current consumers or sensors, but also to round cables, as are used in the ordinary cable harness. The task of the invention is to offer a solution here that simplifies contacting of such flat flexible cables.

BRIEF SUMMARY OF THE INVENTION

According to the invention, it is proposed for this purpose in a flat flexible cable to stagger the widths of the conductor tracks in an arithmetic sequence, to keep the spacings between adjacent conductor tracks always of the same size or also staggered in an arithmetic sequence with the same difference as the width of the conductor track and preferably to perform contacting of the conductor tracks regardless of their width by means of connectors, for example, strip terminals whose contacts are provided equidistant from each other at a spacing equal to the width of the narrowest conductor track, multiplied by the base distance between adjacent conductor tracks.

In this manner it is possible to arrange and design weakly loaded and therefore narrow conductor tracks so that they lie on the end of the flat conductor in the densest arrangement, so that each of these conductor tracks is grasped by one contact of the strip terminal. The next wider conductor track is grasped by two contacts of the strip terminal, the next wider one by three and so forth. Despite the use of uniform connectors, one therefore obtains contacting of the individual conductors tracks adapted to the corresponding current load. If the spacings between adjacent conductor tracks do not correspond to the base spacing, they are to be chosen according to a grid that starts from the base spacing and to which a whole number multiple of the same grid spacing as in the conductor track is added. Because of this, the advantage of correct contacting with equidistant arrangement of the contacts of the connector is always retained.

This also permits a simple transition to other flat cables or round cables, since only the individual contacts (pins) of the connectors need be connected to corresponding wires of a round cable and to circuit boards or instrument bases on which the connectors can be directly mounted.

It is naturally possible to provide thickness staggering of the conductor tracks in addition to width staggering, which, however, preferably does not occur within one flat flexible cable so that in one flat flexible cable only conductor tracks of one thickness but optionally of different width are provided.

In one embodiment of the invention, it is proposed to choose as grid size 2.54 mm (0.1 inch) so that the width of the conductor tracks is a whole-number multiple of 2.54 mm and to choose as spacing between adjacent conductor tracks 1 mm to create electrical insulation so that the narrowest conductor track has a width of 1.54 mm, the next one 2×2.54−1 mm, the next one 3×2.54−1 mm, etc. Similarly, the spacing between adjacent conductor tracks is 1 mm or 1 mm plus a whole-number multiple of 2.54 mm, so that the base spacing between adjacent conductor tracks is 1 mm, the next one 2.54+1 mm, the next one 2 ×2.54 1 mm, the next one 3×2.54+1 mm, etc. This permits particularly simple connection to the generally used PCB circuit boards, as are commonly used in the automotive industry, but also elsewhere in electronics.

The invention offers the additional advantage that it is possible with it to produce the employed connectors as endless products, which need no longer be adapted to the width of the flat flexible cables being contacted. The variety of previously necessary connectors therefore completely drops out and it is only necessary to provide connectors of different height for the conductor tracks of different thickness, which, however, can be easily segregated from each other by color coding and require no major logistic expense.

BRIEF DESCRIPTION OF THE DRAWING

The invention is further explained below with reference to the drawing. The single FIGURE shows different division possibilities in which, in the depicted example, only conductor tracks 2, 2', 2" of one width are always provided in each of the depicted sections of the different flat flexible cables 1, 1', etc. This is naturally not necessary and conductor tracks of different widths can also be provided in flat flexible cable.

DETAILED DESCRIPTION OF PREFERRED EMBODIMENTS

As follows from the FIGURE, it is possible to contact the wide conductor tracks 2" more often than the narrow ones 2' or 2 with equidistantly arranged contacts of a connector or another connection, symbolized by the dashed, equidistant line 3, so that a correspondingly stronger current can be conveyed or transferred both in the conductor track and in the connection without having to abandon the advantages of a uniform size of the flat flexible cable or equidistant identical contacts in the connectors.

The thickness of the individual conductor tracks permits further adaptation to the current intensity, as is apparent from the following table and it is therefore possible to cover a large range of conductor cross sections. It is then also possible to provide conductor tracks of different thickness in one flat flexible cable, although handling of the endless material might be problematical during large differences in thickness.

TABLE

| Grid number | Width | Cross section at a thickness d of | | | |
|---|---|---|---|---|---|
| | | d = 0.15 | d = 0.2 | d = 0.2273 | d = 0.25 |
| 8 | 19.32 | 2.90 | 3.86 | 4.32 | 4.83 |
| 7 | 16.78 | 2.52 | 3.36 | 3.81 | 4.20 |
| 6 | 14.24 | 2.14 | 2.85 | 3.24 | 3.56 |
| 5 | 11.7 | 1.76 | 2.34 | 2.66 | 2.93 |
| 4 | 9.16 | 1.37 | 1.83 | 2.08 | 2.29 |
| 3 | 6.62 | 0.99 | 1.32 | 1.50 | 1.66 |
| 3 | 4.08 | 0.61 | 0.82 | 0.93 | 1.02 |
| 1 | 1.54 | 0.23 | 0.31 | 0.35 | 0.39 |

The invention is naturally not restricted to the described and depicted variant but can be modified and altered in different ways. Thus, it is possible in laminated flat flexible cables to use more than one support or cover sheet and to select the dimensions mentioned in the description differently. The mentioned absolute dimensions are only preferred because of their direct compatibility with the commercially available circuit boards.

Ordinarily an attempt is made merely for space and cost reasons to get by with the spacings 4 between adjacent conductor tracks being the base spacing between adjacent conductor tracks, but when this is not possible or desired, the objective of the invention can also be achieved by the mentioned staggering.

All materials that are used in ordinary flat flexible cables, be they laminated or extruded, can be used as materials for the flat flexible cables according to the invention.

What is claimed is:

1. Laminated or extruded flat flexible cable comprising electrical flat conductor tracks, characterized by the fact that the widths of conductor tracks (2, 2', 2") are variable and are staggered in an arithmetic sequence, and that the spacings (4) between adjacent conductor tracks are of the same size or also staggered in an arithmetic sequence; and wherein contacting of the conductor tracks (2, 2', 2") occurs independently of their width by means of connectors whose contacts are provided equidistant from each other at a spacing equal to the width of a narrowest conductor track multiplied by a base spacing between the conductor tracks.

2. A laminated or extruded flat flexible cable, characterized by the fact that widths of conductor tracks are staggered in an arithmetic sequence and that the spacings (4) between adjacent conductor tracks are of the same size or also are staggered in an arithmetic sequence, and further characterized by the fact that the width of each conductor track is a whole number multiple of 2.54 mm and that the spacing between adjacent conductor tracks is 1 mm or 1 mm plus a whole number multiple of 2.54 mm.

3. Laminated or extruded flat flexible cable comprising electrical flat conductor tracks, characterized by the fact that the widths of conductor tracks (2, 2', 2") in one plane are staggered in an arithmetic sequence, and that the spacings (4) between adjacent conductor tracks are of the same size or also staggered in an arithmetic sequence.

* * * * *